US 8,502,522 B2

(12) United States Patent
Kharrati et al.

(10) Patent No.: US 8,502,522 B2
(45) Date of Patent: Aug. 6, 2013

(54) MULTI-LEVEL TRIGGERING CIRCUIT

(75) Inventors: Hamid Kharrati, La Jolla, CA (US); Steven D. Roach, Colorado Springs, CO (US); Joseph Sascha Willis, San Marcos, CA (US)

(73) Assignee: Teradyne, Inc., North Reading, MA (US)

( * ) Notice: Subject to any disclaimer, the term of this patent is extended or adjusted under 35 U.S.C. 154(b) by 553 days.

(21) Appl. No.: 12/769,075

(22) Filed: Apr. 28, 2010

(65) Prior Publication Data

US 2011/0267037 A1 Nov. 3, 2011

(51) Int. Cl.
*G01R 27/02* (2006.01)
*G01R 13/00* (2006.01)

(52) U.S. Cl.
USPC .............................. 324/76.12; 702/66; 702/70

(58) Field of Classification Search
USPC ................... 324/76.12–76.38, 121 R, 762.01; 702/66–78, 121–126
See application file for complete search history.

(56) References Cited

U.S. PATENT DOCUMENTS

| | | | |
|---|---|---|---|
| 2,778,883 A | 1/1957 | Buckerfield | |
| 3,573,644 A | 4/1971 | Evel | |
| 3,927,374 A | 12/1975 | Nakaya | |
| 4,097,798 A | 6/1978 | Olson et al. | |
| 4,119,910 A | 10/1978 | Hayashi | |
| 4,147,988 A | 4/1979 | Hall | |
| 4,283,713 A | 8/1981 | Philipp | |
| 4,360,747 A | 11/1982 | Ryan | |
| 4,365,193 A | 12/1982 | Bollero et al. | |
| 4,495,586 A | 1/1985 | Andrews | |
| 4,507,618 A | 3/1985 | Nelson | |
| 4,523,161 A | 6/1985 | Miles | |
| 4,628,253 A | 12/1986 | Yu et al. | |
| 4,647,862 A | 3/1987 | Blair | |
| 4,647,915 A | 3/1987 | Shank et al. | |
| 4,678,345 A | 7/1987 | Agoston | |
| 4,694,244 A | 9/1987 | Whiteside et al. | |
| 4,704,036 A | 11/1987 | Holte et al. | |

(Continued)

FOREIGN PATENT DOCUMENTS

AT 264510 4/2004
AU 200027578 4/2001

(Continued)

OTHER PUBLICATIONS

Roach, Steven D., "Signal Conditioning in Oscilloscopes and the Spirit of Invention", in The Art and Science of Analog Circuit Design, ed. Jim Williams, Butterworth-Heinemann, Boston (1995).

(Continued)

*Primary Examiner* — Joshua Benitez-Rosario
(74) *Attorney, Agent, or Firm* — Fish & Richardson P.C.

(57) ABSTRACT

Circuitry includes a comparator to compare an input analog signal to a threshold and to output a signal that is based on the comparison; a first circuit path to receive the signal and to detect a characteristic of the signal, where the first circuit path is configured to support triggering at a first frequency; a second circuit path to receive the signal and to detect the characteristic of the signal, where the second circuit path is configured to support triggering at a second frequency that is lower than the first frequency; and a selector to select an output of the first circuit path or an output of the second circuit path.

21 Claims, 4 Drawing Sheets

(56) References Cited

U.S. PATENT DOCUMENTS

| | | | |
|---|---|---|---|
| 4,716,345 A | 12/1987 | Shank et al. | |
| 4,755,951 A | 7/1988 | Hollister | |
| 4,779,045 A | 10/1988 | Shank | |
| 4,855,968 A | 8/1989 | Shank | |
| 5,034,698 A | 7/1991 | Moriyasu | |
| 5,097,147 A | 3/1992 | Stuebing et al. | |
| 5,119,404 A | 6/1992 | Aihara | |
| 5,121,075 A | 6/1992 | Roach | |
| 5,180,932 A | 1/1993 | Bengel | |
| 5,222,028 A | 6/1993 | LaBarre et al. | |
| 5,223,784 A | 6/1993 | Nelson et al. | |
| 5,225,776 A | 7/1993 | Dobos et al. | |
| 5,289,500 A | 2/1994 | Inou et al. | |
| 5,315,627 A | 5/1994 | Draving | |
| 5,319,266 A | 6/1994 | Chu et al. | |
| 5,498,985 A | 3/1996 | Parle et al. | |
| 5,706,222 A | 1/1998 | Bonaccio et al. | |
| 5,754,827 A | 5/1998 | Barbier et al. | |
| 5,777,489 A | 7/1998 | Barbier et al. | |
| 5,912,593 A | 6/1999 | Susak et al. | |
| 5,933,129 A | 8/1999 | Egami et al. | |
| 6,057,706 A | 5/2000 | Barbier et al. | |
| 6,218,904 B1 | 4/2001 | Panther | |
| 6,265,894 B1 | 7/2001 | Reblewski et al. | |
| 6,366,154 B2 | 4/2002 | Pulvirenti | |
| 6,377,106 B1 | 4/2002 | Rozsypal | |
| 6,388,465 B1 | 5/2002 | Barbier et al. | |
| 6,400,219 B1 | 6/2002 | Fayed | |
| 6,473,701 B1 | 10/2002 | Tallman et al. | |
| 6,522,083 B1 | 2/2003 | Roach | |
| 6,560,494 B1 | 5/2003 | Soto et al. | |
| 6,621,913 B1 | 9/2003 | de Vries | |
| 6,681,354 B2 | 1/2004 | Gupta | |
| 6,701,280 B2 | 3/2004 | Horne et al. | |
| 6,717,433 B2 | 4/2004 | Barbier et al. | |
| 6,782,298 B2 | 8/2004 | Soto et al. | |
| 6,801,097 B2 | 10/2004 | Wallace | |
| 6,807,496 B2 | 10/2004 | Pickerd | |
| 6,812,688 B2 * | 11/2004 | Tan et al. | 324/121 R |
| 6,819,170 B1 | 11/2004 | Kindt | |
| 6,832,174 B2 * | 12/2004 | Tran et al. | 702/121 |
| 6,909,979 B2 | 6/2005 | Saitou et al. | |
| 6,927,608 B1 | 8/2005 | Chen et al. | |
| 7,058,548 B2 | 6/2006 | Pupalaikis et al. | |
| 7,065,458 B2 | 6/2006 | Tran et al. | |
| 7,072,804 B2 * | 7/2006 | Weller | 702/190 |
| 7,139,684 B2 | 11/2006 | Pupalaikis et al. | |
| 7,148,754 B2 | 12/2006 | Kaminski | |
| 7,191,079 B2 | 3/2007 | Smith et al. | |
| 7,191,372 B1 | 3/2007 | Jacobson et al. | |
| 7,219,037 B2 | 5/2007 | Pupalaikis et al. | |
| 7,222,055 B2 | 5/2007 | Pupalaikis et al. | |
| 7,236,900 B2 | 6/2007 | Hagen et al. | |
| 7,245,163 B2 | 7/2007 | Nakamura | |
| 7,262,632 B2 | 8/2007 | Hazucha et al. | |
| 7,280,930 B2 | 10/2007 | Kobayashi | |
| 7,282,965 B2 | 10/2007 | Hatooka et al. | |
| 7,285,946 B2 | 10/2007 | Ems et al. | |
| 7,304,550 B2 | 12/2007 | Rostami et al. | |
| 7,365,617 B2 | 4/2008 | Rostami et al. | |
| 7,373,281 B2 | 5/2008 | Pupalaikis et al. | |
| 7,386,409 B2 | 6/2008 | Mueller et al. | |
| 7,394,410 B1 * | 7/2008 | Wegener | 341/61 |
| 7,519,513 B2 | 4/2009 | Pupalaikis et al. | |
| 7,616,066 B2 | 11/2009 | Ishii et al. | |
| 7,642,822 B2 | 1/2010 | Baker et al. | |
| 7,646,766 B2 | 1/2010 | Schmidt et al. | |
| 7,868,664 B2 | 1/2011 | Markozen et al. | |
| 7,881,414 B2 | 2/2011 | Kimura et al. | |
| 7,944,229 B2 | 5/2011 | Joshi et al. | |
| 8,239,158 B2 | 8/2012 | Crain et al. | |
| 8,305,903 B1 * | 11/2012 | Louise et al. | 370/241 |
| 8,386,208 B2 * | 2/2013 | Cake et al. | 702/123 |
| 8,433,532 B2 | 4/2013 | LeBrun et al. | |
| 8,433,543 B2 | 4/2013 | LeBrun et al. | |
| 2002/0089349 A1 | 7/2002 | Barbier et al. | |
| 2002/0104051 A1 | 8/2002 | Gupta | |
| 2002/0175732 A1 | 11/2002 | Blon et al. | |
| 2002/0175739 A1 | 11/2002 | Sidiropoulos et al. | |
| 2002/0196013 A1 | 12/2002 | Goldstein et al. | |
| 2003/0090299 A1 | 5/2003 | Dathe et al. | |
| 2003/0184349 A1 | 10/2003 | Carvajal et al. | |
| 2003/0208330 A1 | 11/2003 | Pickerd | |
| 2003/0223317 A1 | 12/2003 | Soto et al. | |
| 2004/0012454 A1 | 1/2004 | Wallace | |
| 2004/0117138 A1 | 6/2004 | Tran et al. | |
| 2004/0117143 A1 * | 6/2004 | Tran et al. | 702/121 |
| 2004/0128076 A1 | 7/2004 | Pupalaikis et al. | |
| 2004/0178820 A1 | 9/2004 | Barbier et al. | |
| 2005/0089883 A1 | 4/2005 | Weinrich et al. | |
| 2005/0134324 A1 | 6/2005 | Boyer et al. | |
| 2005/0174148 A1 | 8/2005 | Fiedler | |
| 2005/0225310 A1 * | 10/2005 | Smith et al. | 324/121 R |
| 2005/0234670 A1 | 10/2005 | Hagen et al. | |
| 2005/0261853 A1 * | 11/2005 | Dobyns | 702/108 |
| 2006/0074606 A1 | 4/2006 | Pupalaikis et al. | |
| 2006/0080065 A1 | 4/2006 | Pupalaikis et al. | |
| 2006/0106502 A1 * | 5/2006 | See et al. | 700/286 |
| 2006/0145768 A1 | 7/2006 | Kaminski | |
| 2006/0161401 A1 | 7/2006 | Pupalaikis et al. | |
| 2006/0176151 A1 | 8/2006 | Ems et al. | |
| 2006/0177018 A1 | 8/2006 | Kobayashi et al. | |
| 2006/0178850 A1 | 8/2006 | Kobayashi | |
| 2006/0195301 A1 | 8/2006 | Mueller et al. | |
| 2006/0202748 A1 | 9/2006 | Furukawa et al. | |
| 2006/0238270 A1 | 10/2006 | Rostami et al. | |
| 2006/0244494 A1 | 11/2006 | Cetrulo et al. | |
| 2006/0259256 A1 | 11/2006 | Roach | |
| 2007/0013449 A1 | 1/2007 | Ishii et al. | |
| 2007/0027658 A1 | 2/2007 | Pupalaikis et al. | |
| 2007/0069768 A1 | 3/2007 | Hatooka et al. | |
| 2007/0112532 A1 | 5/2007 | Pupalaikis et al. | |
| 2007/0126525 A1 | 6/2007 | Nicholson | |
| 2007/0185669 A1 | 8/2007 | Pupalaikis et al. | |
| 2007/0247256 A1 | 10/2007 | Rostami et al. | |
| 2008/0054967 A1 | 3/2008 | Kobayashi | |
| 2008/0061844 A1 | 3/2008 | Zeng et al. | |
| 2008/0120053 A1 | 5/2008 | Pupalaikis et al. | |
| 2008/0130654 A1 | 6/2008 | Schmidt et al. | |
| 2008/0258957 A1 | 10/2008 | Pupalaikis et al. | |
| 2008/0309355 A1 | 12/2008 | Nozaki et al. | |
| 2009/0002213 A1 | 1/2009 | LaMarche et al. | |
| 2009/0027086 A1 | 1/2009 | Trifonov | |
| 2009/0066403 A1 | 3/2009 | Horsky et al. | |
| 2009/0108906 A1 | 4/2009 | Butler | |
| 2009/0251186 A1 | 10/2009 | Nedachi | |
| 2009/0267666 A1 | 10/2009 | Marutani | |
| 2010/0039157 A1 | 2/2010 | Kaeriyama et al. | |
| 2010/0102868 A1 | 4/2010 | Kim et al. | |
| 2010/0117699 A1 | 5/2010 | Wu et al. | |
| 2010/0176847 A1 | 7/2010 | Kitsunezuka et al. | |
| 2010/0182050 A1 | 7/2010 | Markozen et al. | |
| 2011/0043270 A1 | 2/2011 | Kusuda | |
| 2011/0115526 A1 | 5/2011 | Ouchi | |
| 2011/0187424 A1 | 8/2011 | Grewing et al. | |
| 2011/0191066 A1 | 8/2011 | Delbue et al. | |
| 2011/0267030 A1 * | 11/2011 | Roach | 324/76.12 |
| 2011/0267036 A1 | 11/2011 | Kharrati et al. | |
| 2011/0267037 A1 | 11/2011 | Kharrati et al. | |
| 2011/0267214 A1 | 11/2011 | Roach | |
| 2012/0212251 A1 * | 8/2012 | Yanagishima et al. | 324/762.01 |

FOREIGN PATENT DOCUMENTS

| | | |
|---|---|---|
| AU | 2003252059 | 2/2004 |
| AU | 2003291653 | 5/2004 |
| CA | 1126866 | 6/1982 |
| CA | 1203295 | 4/1986 |
| CA | 1278344 | 12/1990 |
| CA | 2238955 | 11/1999 |
| CA | 2272740 | 11/1999 |
| CA | 2353950 | 4/2001 |
| CN | 1399724 | 2/2003 |
| CN | 1675822 | 9/2005 |
| CN | 1723621 | 1/2006 |

| | | |
|---|---|---|
| CN | 101116066 | 1/2008 |
| DE | 2824103 | 12/1978 |
| DE | 3065612 | 12/1983 |
| DE | 3335868 | 4/1984 |
| DE | 60009856 | 5/2004 |
| DE | 102004019966 | 11/2005 |
| DE | 102006040793 | 6/2007 |
| EP | 0023708 | 2/1981 |
| EP | 0250682 | 1/1988 |
| EP | 0278637 | 8/1998 |
| EP | 1133702 | 9/2001 |
| EP | 1359427 | 11/2003 |
| EP | 1554807 | 7/2005 |
| EP | 1738185 | 1/2007 |
| EP | 1836586 | 9/2007 |
| EP | 1846770 | 10/2007 |
| EP | 1847103 | 10/2007 |
| FR | 2393472 | 12/1978 |
| FR | 2534090 | 4/1984 |
| GB | 1583550 | 1/1981 |
| GB | 2130038 | 5/1984 |
| GB | 2433659 | 6/2007 |
| IN | 00025CN2005 | 4/2007 |
| IT | 1119341 | 3/1986 |
| JP | 54-002019 | 1/1979 |
| JP | 59-086322 | 5/1984 |
| JP | 63-5270 | 1/1988 |
| JP | 63-193068 | 8/1988 |
| JP | 02-007609 | 1/1990 |
| JP | 02-052282 | 2/1990 |
| JP | 03-211695 | 9/1991 |
| JP | 04-212067 | 8/1992 |
| JP | 06-034666 | 2/1994 |
| JP | 09-318669 | 12/1997 |
| JP | 2002-544576 | 12/2002 |
| JP | 2003-329709 | 11/2003 |
| JP | 2006-504100 | 2/2006 |
| JP | 2007-159118 | 6/2007 |
| JP | 2008-521014 | 6/2008 |
| MX | PA05000704 | 4/2005 |
| NL | 7806065 | 12/1978 |
| NL | 8303383 | 5/1984 |
| NL | 8901648 | 1/1990 |
| NL | 187880 | 9/1991 |
| TW | 339409 | 9/1998 |
| WO | WO01/23901 | 4/2001 |
| WO | WO2004/010571 | 1/2004 |
| WO | WO2004/038432 | 5/2004 |
| WO | WO2005/103736 | 11/2005 |
| WO | WO2006/055935 | 5/2006 |
| WO | WO2006/086256 | 8/2006 |
| WO | WO2006/086257 | 8/2006 |
| WO | WO2006/086258 | 8/2006 |
| WO | WO2006/093541 | 9/2006 |

OTHER PUBLICATIONS

White Paper "XYZs of Oscilloscopes: Primer", TEK1511 / 03W-8605-5, (c) 2009 Tektronix.

Agilent Technologies Application Note 1608, "What is the difference between an equivalent time sampling oscilloscope and a real-time oscilloscope?", 5989-8794EN, (c) 2008 Agilent Technologies, Inc.

Search Report for U.S. Appl. No. 12/769,065, entitled "Fixed-Price Novelty Search Report" (2010).

Search Report for U.S. Appl. No. 12/769,082, entitled "Fixed-Price Novelty Search Report" (2010).

Search Report for U.S. Appl. No. 12/769,114, entitled "Fixed-Price Novelty Search Report" (2010).

Search Report for U.S. Appl. No. 12/769,075, entitled "Fixed-Price Novelty Search Report" (2010).

Highlighted U.S. Patent Publication No. US2004117138 (Tran et al., Pub Date: Jun. 17, 2004).

Action and Response History in US Publication No. US2004/0117138, Jul. 20, 2010.

File History for US Patent No. 5,121,075 (Issue Date: Jun. 9, 1992).

Teradyne, Inc., "Prior Art Fig. 1: Ai760 DSO Rev A showing differential drive comparators with trigger level control . . . ", (Aug. 2007).

Teradyne, Inc., "Prior Art Fig. 1: Ai760 Rev A DSO and prior art references listed in Section 7", (Aug. 2007).

* cited by examiner

MULTI-LEVEL TRIGGERING CIRCUIT

CROSS-REFERENCE TO RELATED APPLICATIONS

The following patent applications, all of which were filed on the same day, are related: (1) U.S. patent application Ser. No. 12/769,065, entitled "Connecting Digital Storage Oscilloscopes", (2) U.S. patent application Ser. No. 12/769,082, entitled "Driving An Electronic Instrument", (3) U.S. patent application Ser. No. 12/769,114, entitled "Attenuator Circuit", now U.S. Pat. No. 8,098,181; and (4) U.S. patent application Ser. No. 12/769,075, entitled "Multi-Level Triggering Circuit". The disclosure of each of these patent applications is hereby incorporated by reference into this patent application as if set forth herein in full.

TECHNICAL FIELD

This patent application relates generally to a multi-level triggering circuit.

BACKGROUND

An oscilloscope is an instrument for graphically displaying measured electrical parameters, such as voltage. Typically, an oscilloscope's graphical display includes a two-dimensional plot of the electrical parameter versus time.

Originally, oscilloscopes were analog devices, which displayed their graphics on a cathode ray tube (CRT). Newer types of oscilloscopes are digital. For example, a digital storage oscilloscope (DSO) can convert analog signals to digital form, store those signals, and process the signals for display, typically on a liquid crystal display (LCD) device.

DSOs typically use high-speed custom digital integrated circuits (ICs) to obtain high-speed triggering with complex, advanced triggering features. These ICs are often bipolar logic circuits rather than common, low-cost CMOS circuits. As a result, these ICs are expensive and consume relatively large amounts of power. Programmable logic typically does not enable triggering at the high speeds required by DSOs.

SUMMARY

This patent application describes a multi-level triggering circuit.

For example, this patent application describes circuitry comprising a comparator to compare an input analog signal to a threshold and to output a signal that is based on the comparison; a first circuit path to receive the signal and to detect a characteristic of the signal, where the first circuit path is configured to support triggering at a first frequency; a second circuit path to receive the signal and to detect the characteristic of the signal, where the second circuit path is configured to support triggering at a second frequency that is lower than the first frequency; and a selector to select an output of the first circuit path or an output of the second circuit path. This apparatus may include one or more of the following features, alone or in combination.

The first circuit path may be a part of an integrated circuit and the second circuit path may be part of a field-programmable gate array (FPGA). The integrated circuit and the FPGA may be parts of a digital storage oscilloscope (DSO). The FPGA may be configured to include functionality for the DSO that is separate from, and in addition to, the second circuit path. The integrated circuit may consume more power than the FPGA to perform triggering. The FPGA may further comprise advanced triggering logic to perform processing on the signal. The first frequency may be about 1 GHz or less and the second frequency may be about 600 MHz or less. The first circuit path may comprise an edge detector for detecting either a rising edge or a falling edge of the signal; the second circuit path may comprise an edge detector for detecting either the rising edge or the falling edge of the signal; and the characteristic detected by the first circuit path and the second circuit path may comprise the rising edge or the falling edge. The first circuit path may comprise a first flip-flop triggered by a first version of the signal and a second flip-flop in series with the first flip-flop and triggered by a time-delayed version of the signal. The second circuit path may comprise triggering logic to generate an intermediate signal based on a version of the signal, and a first flip-flop triggered by the intermediate signal and a second flip-flop in series with the first flip-flop and triggered by a time-delayed version of the intermediate signal.

This patent application also describes a DSO comprising an analog to digital converter (ADC) to convert an input analog signal into a digital signal in accordance with a clock signal, and circuitry to generate a trigger signal. The circuitry comprises a comparator to identify a trigger event for the analog input signal, an edge selector to identify a rising or falling edge of a signal output by the comparator and to produce an asynchronous trigger signal, and a latch to output the trigger signal based on the asynchronous trigger signal and a version of a clock signal. A time interval digitizer is configured to determine a time difference that is based on the asynchronous trigger signal, where the time difference may correspond to a difference between an actual time that the trigger event occurred and a time that a clock signal running the ADC occurred. The edge selector may comprise a first circuit path to receive the signal and to detect a characteristic of the signal, where the first circuit path is configured to support triggering at a first frequency, a second circuit path to receive the signal and to detect the characteristic of the signal, where the second circuit path is configured to support triggering at a second frequency that is lower than the first frequency; and a selector to select an output of the first circuit path or an output of the second circuit path to provide to the time interval digitizer. The DSO may include one or more of the following features, alone or in combination.

The DSO may comprise memory and a controller to capture data from the ADC based on the time difference and to store the data in the memory. The first circuit path may be part of an integrated circuit and the second circuit path may be part of a field-programmable gate array (FPGA). The FPGA may be configured to include functionality for the DSO that is separate from, and in addition to, the second circuit path. The integrated circuit may consume more power than the FPGA to perform triggering. The first frequency may be about 1 GHz or less and the second frequency may be about 600 MHz or less. The FPGA further may comprise advanced triggering logic to perform processing on the signal. The characteristic detected by the first circuit path and the second circuit path may comprise the rising edge or the falling edge. The first circuit path may comprise a first flip-flop triggered by a first version of the signal and a second flip-flop in series with the first flip-flop and triggered by a time-delayed version of the signal. The second circuit path may comprise triggering logic to generate an intermediate signal based on a version of the signal, and a first flip-flop triggered by the intermediate signal and a second flip-flop in series with the first flip-flop and triggered by a time-delayed version of the intermediate signal.

Any two or more of the features described in this summary section may be combined to form embodiments not specifically described in this patent application.

All or part of the foregoing may be implemented as a computer program product comprised of instructions that are stored on one or more machine-readable media, and that are executable on one or more processing devices. All or part of the foregoing may be implemented as an apparatus, method, or system that may include one or more processing devices and memory to store executable instructions to implement functionality.

The details of one or more examples are set forth in the accompanying drawings and the description below. Further features, aspects, and advantages will become apparent from the description, the drawings, and the claims.

DETAILED DESCRIPTION

Described herein is a way of segregating high-speed triggering circuitry from lower-speed, higher-complexity triggering circuitry. The segregated circuitry may be used with any device that requires triggering, including a digital storage oscilloscope (DSO). The high-speed triggering circuitry may be implemented in an application-specific integrated circuit (IC), which is capable of providing high-speed triggering signals (e.g., on the order of 1 GHz). Alternatively, the high-speed triggering circuitry may be implemented using small-scale integration components, such as individual flip-flops and logic gates, mounted on a printed circuit board. The low-speed triggering circuitry may be implemented in programmable logic, such as a field-programmable gate array (FPGA). FPGAs typically cannot produce frequencies as high as ICs. For example, FPGAs can provide triggering signals on the order of 600 MHz. FPGAs, however, can implement integrated triggering logic, which supports more complex triggering functions without taking-up additional board real estate.

Figure 1:
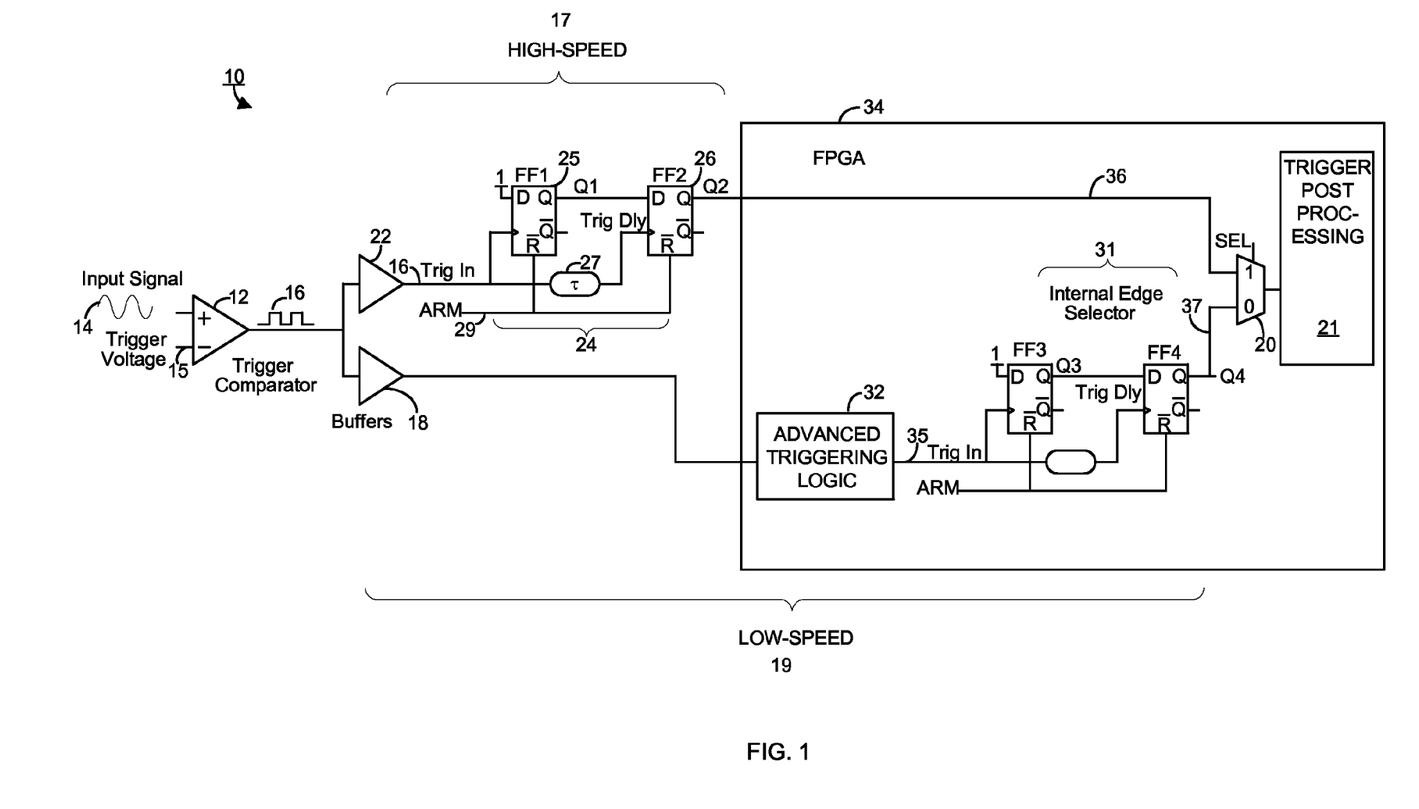
FIG. 1 is a block diagram of a multi-level triggering circuit.

Thus, in the examples described below, an FPGA is used to implement complex advanced triggering features at relatively limited speed, while a high-speed board-level circuit (in this example, an IC) is retained for simpler, higher-speed edge triggering. In one implementation, the smallest possible amount of logic is implemented in fast, "power hungry" technology at the board level. A richer, more complex set of logic is used in the FPGA to implement logic-intensive triggering functions. Partitioning of high-speed and high-complexity triggering circuits allows an FPGA of moderate performance to support a high-speed oscilloscope with advanced triggering features FIG. 1 shows an example of a multi-level triggering circuit 10, which may be used in a DSO or any other type of instrument or circuit that requires triggering. Multi-level triggering circuit 10 includes a comparator 12 to compare an input analog signal 14 to a threshold voltage 15 and to output a signal 16 that is based on that comparison. Multi-level triggering circuit 10 includes a high-speed-trigger circuit path 17 to receive signal 16 and to detect a characteristic of that signal, and a low-speed-trigger circuit path 19 to receive signal 16 and to detect a characteristic of that signal. A selector 20, downstream of circuit paths 17 and 19, is configured select an output of high-speed-trigger circuit path 17 or an output of low-speed-trigger circuit path 19 to provide to trigger post-processing circuit 21.

In more detail, comparator 12 compares an input analog signal 14 to a threshold voltage 15. A trigger event occurs when input analog signal 14 exceeds threshold voltage 15. In response, comparator 12 outputs a signal 16. Signal 16 is applied to high-speed-trigger circuit path 17. High-speed-trigger circuit path 17 includes a buffer 22 to buffer signal 16 prior to its application to the edge detector 24 of high-speed-trigger circuit path 17. Edge detector 24 of high-speed-trigger circuit path 17 includes two serially-connected D-flip flops 25 and 26. In operation, the Q output of each flip-flop 25, 26 takes on the state of the D input at the moment of a positive edge (or negative edge if the input is active low) of signal 16 ("Trig In"), which is applied from buffer 22.

The original version of signal 16 is applied to flip-flop 25 and a time-delayed version of signal 16 is applied to flip-flop 26. The time delay may be implemented by a buffer or other circuit element 27, and is labeled Tin FIG. 1. The D input of flip-flop 25 is a "1" value. That value is applied to the Q output of flip-flop 25 at the rising or falling edge of signal 16. The Q output of flip-flop 25 is applied to the D input of flip flop 26. That value (at the D input) is applied to the Q output of flip flop 26 at the rising or falling edge of the time-delayed version of signal 16. This Q output of D flip-flop 26 constitutes the high-speed trigger signal output of high-speed-trigger circuit path 17. The ARM signal 29, shown in FIG. 1, may be applied to reset the flip-flops after an initial trigger event.

The serial flip-flop configuration reduces the chances that an improper rising or falling edge of signal 16 is detected. That is, performing the detection at two times along the signal path reduces the chances that signal fluctuations will cause inaccurate edge detection.

Low-speed-trigger circuit path 19 is implemented in FPGA 34, as shown in FIG. 1, includes buffer 18 and has the same edge detector circuitry 31, in the same configuration, as that described above for high-speed-trigger circuit path 17. Low-speed-trigger circuit path 19 also includes advanced triggering logic 32. Advanced triggering logic 32 may include any circuitry, logic gates, or the like, that is/are programmed in FPGA 34 and that, in any way, affects the trigger signal, e.g., its shape, timing, or the like. Advanced triggering logic 32 generates an intermediate signal 35 ("Trig In"), which is applied to the edge detector circuitry 31 of low-speed-trigger circuit path 19, and which is processed in the same manner as signal 16 was processed in edge detector circuitry 24 of high-speed-trigger circuit path 17

Selector 20 selects either the trigger signal 37 from low-speed-trigger circuit path 19 or the trigger signal 36 from high-speed-trigger circuit path 17 for application to downstream trigger post-processing circuit 21. In this example, trigger post-processing circuit 21 is implemented in FPGA 34. However, all or part of trigger post-processing circuit 21 may be implemented outside of FPGA 34, either in hardware, software, and/or programmable logic.

Selector 20 may be actuated by other circuitry (not shown), e.g., which detects the triggering requirements of an instrument (e.g., high-speed or low-speed), and which selects the appropriate speed trigger signal. Other factors may be used in determining which signal to select, such as the complexity of the triggering requirements.

Advantages of separating the high-speed triggering circuitry from the lower-speed, high-complexity triggering circuitry include, but are not limited to, power savings and space savings. For example, ICs typically have relatively high power requirements. Incorporating all of the triggering circuitry in an IC can cause relatively high power consumption. By contrast, the power consumption of an FPGA is lower than in an IC. By incorporating some of the triggering circuitry in an FPGA, overall power consumption can be reduced.

Figure 2:
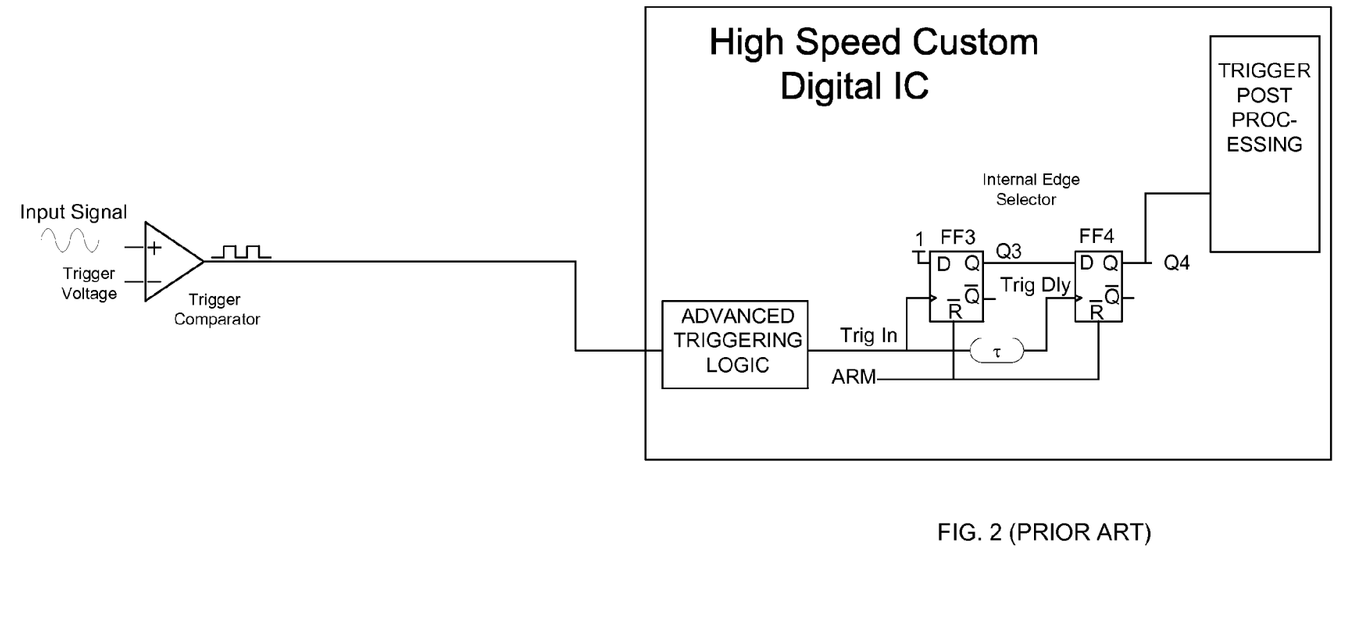
FIG. 2 is a block diagram of a prior art triggering circuit.

Furthermore, devices, such as DSOs, typically include programmable logic, such as FPGAs, to implement other functions. Incorporating a low-speed-trigger circuit path into such pre-existing programmable logic reduces the size of the IC required for the trigger circuit. That is, heretofore, both the low-speed-trigger circuit path and the high-speed-trigger circuit path were implemented in an IC, as shown in FIG. 2. By implementing the low-speed-trigger circuit path in the pre-existing programmable logic, the size of the trigger circuitry IC can be reduced, resulting in circuit board real estate savings. It is also possible to incorporate the low-speed-trigger circuit path in a new (i.e., not pre-existing) FPGA.

The implementation shown in FIG. 1 may be modified. For example, circuit elements, such as the comparator, the flip-flops, and the buffers may be left-out in some implementations and/or substituted with other circuit elements. Furthermore, the low-speed-trigger circuit path and high-speed-trigger circuit path may produce trigger signals at any low and high relative frequencies. 600 MHz and 1 GHz are examples of high- and low-speed triggering signals; however, the circuitry described herein may be used to generate trigger signals having any relatively high- and low-frequency signals.

The circuitry of FIG. 1 may be incorporated into any device, instrument, circuit, etc. that requires triggering. One example, as noted above, is a DSO. An example of a structure of a DSO in which the circuitry of FIG. 1 may be implemented is described below.

Figure 3:
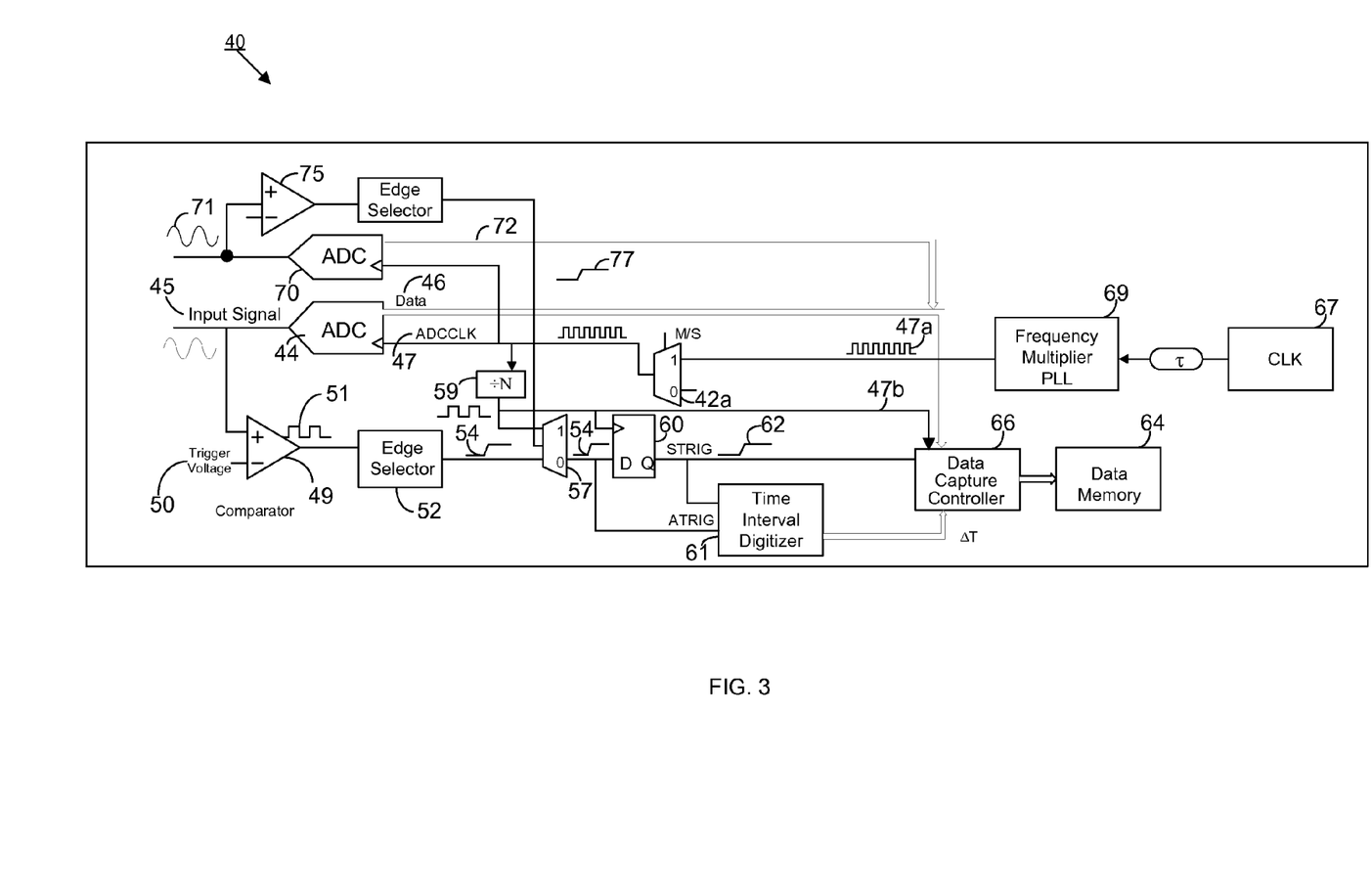
FIG. 3 is a block diagram of a digital storage oscilloscope that may incorporate the multi-level triggering circuit of FIG. 1.

Referring to FIG. 3, DSO 40 includes an analog-to-digital converter (ADC) 44 for receiving an input analog signal 45 and for converting that analog signal to a digital signal 46 (i.e., digital data) in accordance with a clock signal 47. In this example, clock signal 47 is typically on the order of two gigahertz (2 GHz); however, any frequency may be used. The input analog signal 45 is the signal that the DSO will eventually reconstitute for display.

DSO 40 also includes a comparator 49 to identify when input analog signal 45 exceeds a predefined voltage threshold. This is referred to as the threshold event, and is the point from which input analog signal 45 is referenced. Comparator 49 receives input analog signal 45 at its positive input and the voltage threshold 50 (trigger voltage) at its negative input. When input analog signal 45 exceeds voltage threshold 50, comparator 49 outputs a signal 51. Any type of signal may be used to indicate that an edge has been detected.

Figure 4:
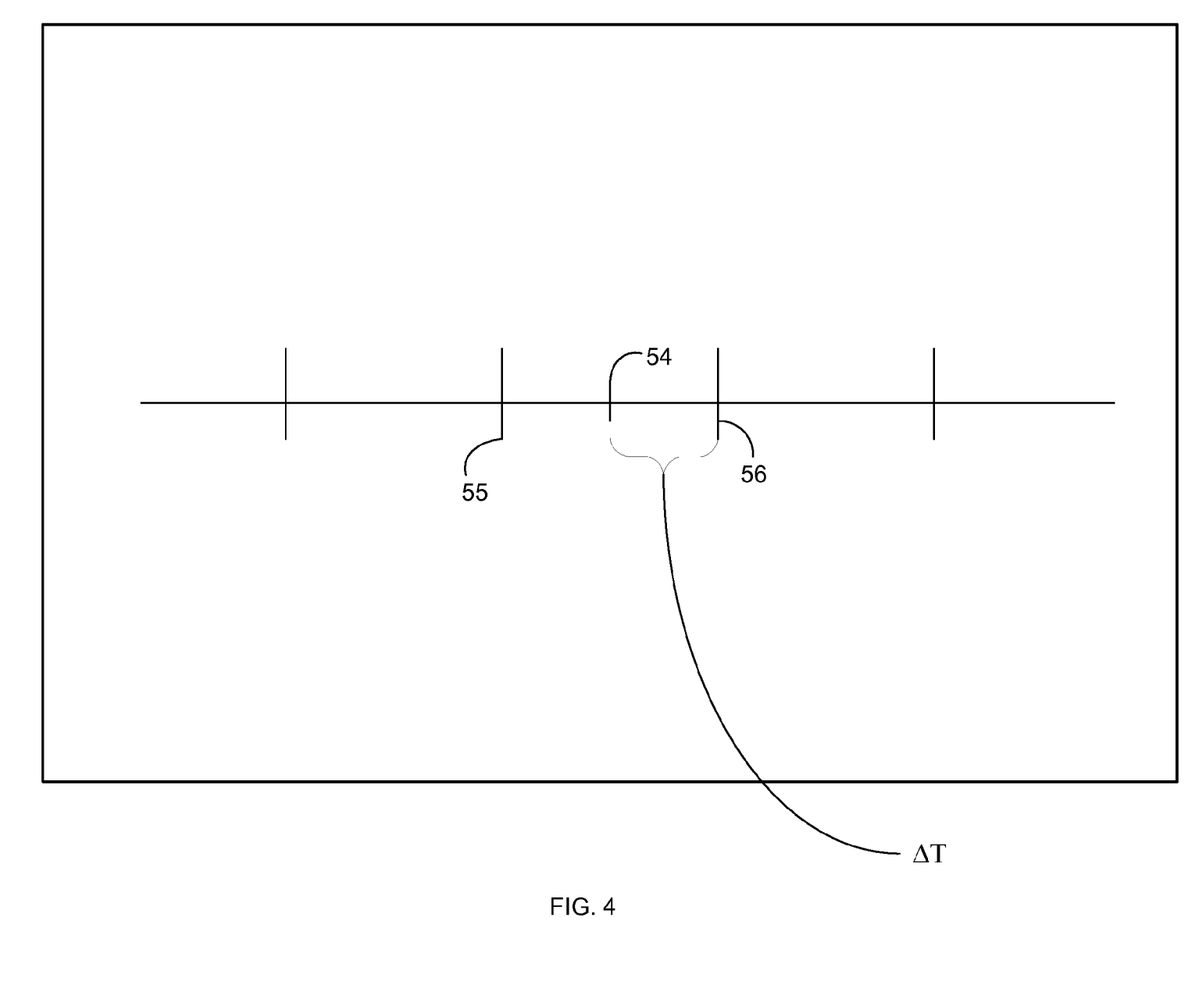
FIG. 4 is a plot showing a detected asynchronous trigger signal relative to pulses of a clock signal used to sample an input analog signal.

Edge selector 52 is a circuit that identifies either a rising edge or a falling edge of signal 51 output by comparator 49. The output of edge selector 52 constitutes an asynchronous trigger signal 54. Signal 54 is asynchronous because it is not in phase with clock signal 47. Rather, since signal 54 was detected in "real-time", it will likely fall in between two pulses 55, 56 of clock signal 47, as shown in FIG. 4. Comparator 49 may be comparator 12 of FIG. 1, and edge selector 52 may be implemented using the circuitry of FIG. 1, namely, an IC for a high-speed-trigger circuit path 17 and an FPGA for a low-speed-trigger circuit path 19. The trigger post processing circuit 21 of FIG. 1 may include all or part of any of the following circuitry of DSO 40.

Selector circuit 57 can be a flip-flop or other circuitry that is used to select, for output, either an asynchronous trigger signal (e.g., 54) or a version of clock signal 47. A step-down circuit 59 may be used to produce the version of clock signal 47. For example, step-down circuit 59 may reduce the frequency of clock signal 47. A purpose of the step-down circuit (divide-by-N block) is to reduce the clock rate to something more easily handled by the time interval digitizer and the circuitry that controls acquisition and data storage. The sample rate is reduced inside the data capture controller, and it is user programmable. Thus, the step-down circuit reduces the clock rate for practical signal handling purposes and does not change the functionality of the system. The user may set program the step-down circuit via a computer or other instrument controls communicatively coupled to DSO 40.

Assuming that selector circuit 57 selects asynchronous trigger signal 54, selector circuit 57 outputs asynchronous trigger signal 54 (ATRIG) to both a latch circuit 60 and a time interval digitizer 61. Latch circuit 60 receives asynchronous trigger signal 54 and, in accordance with clock signal 47 (the full or stepped-down version), outputs a synchronous trigger signal 62 (STRIG). Synchronous trigger signal 62 is synchronous because it is in phase with clock signal 47, unlike asynchronous trigger signal 54, which is likely not in phase with clock signal 47. In this regard, it is noted that, in some cases, synchronous trigger signal 62 and asynchronous trigger signal 54 may both be in phase with clock signal 47. These cases, however, are coincidental, and not necessarily intended.

Time interval digitizer 61 is a circuit and/or controller that determines the real-time difference ($\Delta T$, also referred to as "initial X") between the asynchronous trigger signal 54 and the clock signal 47. The phase of clock signal 47 is represented, in time interval digitizer 61, by synchronous trigger signal 62, since synchronous trigger signal 62 is in phase with clock signal 47. Referring to FIG. 4, this difference is labeled $\Delta T$. This difference, $\Delta T$, is used by a microprocessor or other processing device (not shown) to reconstruct original analog signal 45 using digital data stored in data memory 64 for display on the DSO, and to relate original analog signal 45 to the detected trigger event.

DSO 40 also includes a data capture controller 66, which may be any type of microcontroller or other processing circuitry. Data capture controller 66 receives (e.g., "captures") data from ADC 44 in accordance with clock signal 47 (the full or stepped-down version). Data capture controller 66 stores this data, along with synchronous trigger signal 62 and $\Delta T$ in data memory 64. As noted above, a microprocessor or other processing device uses this information to reconstruct the original analog signal for display on the DSO.

As shown in FIG. 2, clock signal 47 may be generated by a device 67, such as an oscillator. A frequency multiplier phase-locked loop circuit 69, or other circuitry, may optionally be used to increase the frequency of the clock.

DSO 40 may be two-channel, meaning that two separate input analog signals can be tracked relative to the same internal trigger signal. So, in FIG. 2, DSO 40 contains a second ADC 70 for receiving a second input analog signal 71. The second ADC 71 receives clock signal 47, and produces a second digital signal 72. Second digital signal 72, is provided to, and stored via, data capture controller 36 in the manner described above. DSO 40 also includes a second comparator 75 and a second edge selector circuit 76 for generating a second asynchronous trigger signal 77. These components may have the same structure and function as their counterparts described above. Selector circuit 57 selects either the first asynchronous trigger signal 54 or the second asynchronous trigger signal 77 for subsequent processing to determine ΔT. The selected asynchronous trigger signal is processed by the downstream DSO circuitry in the manner described above.

A microprocessor or other processing device or circuitry may use the digital data and ΔT values to reproduce the original analog signals, and relate them to the same triggering event.

Any of the functionality described herein and their various modifications (hereinafter "the functions"), are not limited to the hardware and software described herein. All or part of the functions can be implemented, at least in part, via a computer program product, e.g., a computer program tangibly embodied in an information carrier, such as one or more machine-readable media, for execution by, or to control the operation of, one or more data processing apparatus, e.g., a programmable processor, a computer, multiple computers, and/or programmable logic components.

A computer program can be written in any form of programming language, including compiled or interpreted languages, and it can be deployed in any form, including as a stand-alone program or as a module, component, subroutine, or other unit suitable for use in a computing environment. A computer program can be deployed to be executed on one computer or on multiple computers at one site or distributed across multiple sites and interconnected by a network.

Actions associated with implementing all or part of the functions can be performed by one or more programmable processors executing one or more computer programs to perform the functions of the calibration process. All or part of the functions can be implemented as, special purpose logic circuitry, e.g., an FPGA (field programmable gate array) and/or an ASIC (application-specific integrated circuit).

Processors suitable for the execution of a computer program include, by way of example, both general and special purpose microprocessors, and any one or more processors of any kind of digital computer. Generally, a processor will receive instructions and data from a read-only memory or a random access memory or both. Components of a computer include a processor for executing instructions and one or more memory devices for storing instructions and data.

Components of different embodiments described herein may be combined to form other embodiments not specifically set forth above. Components may be left out of the circuitry shown in FIGS. 1 and 3 without adversely affecting their operation. Furthermore, various separate components may be combined into one or more individual components to perform the functions described herein.

Any components of the following patent applications may be combined to produce embodiment(s) not specifically described herein: (1) U.S. patent application Ser. No. 12/769,065, entitled "Connecting Digital Storage Oscilloscopes", (2) U.S. patent application Ser. No. 12/769,082, entitled "Driving An Electronic Instrument", (3) U.S. patent application Ser. No. 12/769,114, entitled "Attenuator Circuit", now U.S. Pat. No. 8,098,181; and (4) U.S. patent application Ser. No. 12/769,075, entitled "Multi-Level Triggering Circuit".

Other embodiments not specifically described herein are also within the scope of the following claims.

What is claimed is:

1. Circuitry comprising:
   a comparator to compare an input analog signal to a threshold and to output a signal that is based on comparison of the input analog signal to the threshold;
   a first circuit path to receive the signal and to detect a characteristic of the signal, the first circuit path being configured to support triggering at a first frequency;
   a second circuit path to receive the signal and to detect the characteristic of the signal, the second circuit path being configured to support triggering at a second frequency, the second frequency being lower than the first frequency; and
   a selector to select an output of the first circuit path or an output of the second circuit path.

2. The circuitry of claim 1, wherein the first circuit path is a part of an integrated circuit and the second circuit path is part of a field-programmable gate array (FPGA).

3. The circuitry of claim 2, wherein the integrated circuit and the FPGA are parts of a digital storage oscilloscope (DSO); and
   wherein the FPGA is configured to include functionality for the DSO that is separate from, and in addition to, the second circuit path.

4. The circuitry of claim 2, wherein the integrated circuit consumes more power than the FPGA to perform triggering.

5. The circuitry of claim 2, wherein the FPGA further comprises advanced triggering logic to perform processing on the signal.

6. The circuitry of claim 1, wherein the first circuit path comprises an edge detector for detecting either a rising edge or a falling edge of the signal;
   wherein the second circuit path comprises an edge detector for detecting either the rising edge or the falling edge of the signal; and
   wherein the characteristic detected by the first circuit path and the second circuit path comprises the rising edge or the falling edge.

7. The circuitry of claim 1, wherein the first frequency is about 1 GHz or less and the second frequency is about 600 MHz or less.

8. The circuitry of claim 1, wherein the first circuit path comprises a first flip-flop triggered by a first version of the signal and a second flip-flop, in series with the first flip-flop and triggered by a time-delayed version of the signal.

9. The circuitry of claim 1, wherein the second circuit path comprises:
   triggering logic to generate an intermediate signal based on a version of the signal; and
   a first flip-flop triggered by the intermediate signal and a second flip-flop that is in series with the first flip-flop and triggered by a time-delayed version of the intermediate signal.

10. The circuitry of claim 8, wherein the second circuit path comprises:
    triggering logic to generate an intermediate signal based on a version of the signal; and
    a first flip-flop triggered by the intermediate signal and a second flip-flop that is in series with the first flip-flop and triggered by a time-delayed version of the intermediate signal.

11. A digital storage oscillator (DSO) comprising:
    an analog to digital converter (ADC) to convert an input analog signal into a digital signal in accordance with a clock signal;
    circuitry to generate a trigger signal, the circuitry comprising:
       a comparator to identify a trigger event for the input analog signal;
       an edge selector to identify a rising or falling edge of a signal output by the comparator and to produce an asynchronous trigger signal; and
       a latch to output the trigger signal based on the asynchronous trigger signal and a version of a clock signal; and a time interval digitizer to determine a time difference that is based on the asynchronous trigger signal, the time difference being a difference between an actual time that the trigger event occurred and a time that a clock signal running the ADC occurred;

wherein the edge selector comprises:

a first circuit path to receive the signal and to detect a characteristic of the signal, the first circuit path being configured to support triggering at a first frequency;

a second circuit path to receive the signal and to detect the characteristic of the signal, the second circuit path being configured to support triggering at a second frequency, the second frequency being lower than the first frequency; and a selector to select an output of the first circuit path or an output of the second circuit path to provide to the time interval digitizer.

12. The DSO of claim 11, further comprising:
memory; and
a controller to capture data from the ADC based on the time difference, and to store the data in the memory.

13. The DSO of claim 11, wherein the first circuit path is a part of an integrated circuit and the second circuit path is part of a field-programmable gate array (FPGA).

14. The DSO of claim 13, wherein the FPGA is configured to include functionality for the DSO that is separate from, and in addition to, the second circuit path.

15. The DSO of claim 13, wherein the integrated circuit consumes more power than the FPGA to perform triggering.

16. The DSO of claim 13, wherein the FPGA further comprises advanced triggering logic to perform processing on the signal.

17. The DSO of claim 11, wherein the characteristic detected by the first circuit path and the second circuit path comprises the rising edge or the falling edge.

18. The DSO of claim 11, wherein the first frequency is about 1 GHz or less and the second frequency is about 600 MHz or less.

19. The DSO of claim 11, wherein the first circuit path comprises a first flip-flop triggered by a first version of the signal and a second flip-flop that is in series with the first flip-flop and triggered by a time-delayed version of the signal.

20. The DSO of claim 11, wherein the second circuit path comprises:

triggering logic to generate an intermediate signal based on a version of the signal; and a first flip-flop triggered by the intermediate signal and a second flip-flop that is in series with the first flip-flop and triggered by a time-delayed version of the intermediate signal.

21. The DSO of claim 19, wherein the second circuit path comprises:

triggering logic to generate an intermediate signal based on a version of the signal; and a first flip-flop triggered by the intermediate signal and a second flip-flop that is in series with the first flip-flop and triggered by a time-delayed version of the intermediate signal.

* * * * *